United States Patent [19]
Maling, Jr. et al.

[11] Patent Number: 5,335,143
[45] Date of Patent: Aug. 2, 1994

[54] DISK AUGMENTED HEAT TRANSFER SYSTEM

[75] Inventors: George C. Maling, Jr.; Roger R. Schmidt, both of Poughkeepsie, N.Y.

[73] Assignee: International Business Machines Corporation, Armonk, N.Y.

[21] Appl. No.: 102,447

[22] Filed: Aug. 5, 1993

[51] Int. Cl.⁵ .............................................. H05K 7/20
[52] U.S. Cl. ................................. 361/694; 361/784; 257/706; 257/707; 165/122
[58] Field of Search ............... 257/706, 707, 720, 722, 257/712; 165/121, 122; 362/690, 694, 695, 687, 784

[56] References Cited

U.S. PATENT DOCUMENTS

| | | |
|---|---|---|
| 3,844,341 | 10/1974 | Bimshas et al. ................. 165/104.34 |
| 3,942,586 | 3/1976 | Fries . |
| 4,144,932 | 3/1979 | Voigt . |
| 4,237,521 | 12/1980 | Denker . |
| 4,884,631 | 12/1989 | Rippel . |
| 4,899,210 | 2/1990 | Lorenzetti et al. . |
| 4,923,000 | 5/1990 | Nelson . |
| 4,978,638 | 12/1990 | Buller et al. . |
| 5,169,805 | 12/1992 | Mok et al. . |

FOREIGN PATENT DOCUMENTS 1233796 3/1988 Japan .

Primary Examiner—William Mintel
Assistant Examiner—S. V. Clark
Attorney, Agent, or Firm—Lynn L. Augspurger

[57] ABSTRACT

An enhanced heat transfer system for integrated circuit modules utilizing a parallel finned heat sink integrated with rotating disk fan(s). The disk fan may also be used between printed circuit cards. The addition of holes and/or protuberances to the rotating disk further enhances the heat transfer by disturbing the thermal boundary layer of the heat sink or modules.

10 Claims, 4 Drawing Sheets

DISK AUGMENTED HEAT TRANSFER SYSTEM

FIELD OF THE INVENTION

This invention relates to heat transfer mechanisms, and more particularly to an improved heat transfer mechanism for removing heat generated from high powered air cooled integrated circuit modules.

BACKGROUND OF THE INVENTION

Computer components such as high powered integrated circuit modules are generating increasing amounts of heat. Unless the heat is effectively dissipated, it can cause the modules to malfunction. A common technique to enhance the heat transferal from such a component is to increase the surface area from which the heat is transferred. One method, typical in many industrial applications, is to attach a parallel fin heat sink to such a component. Forced air is then often ducted to the parallel fin heat sink from an air moving device. An assembly such as this composed of an air moving device, ducting, and a heat sink can devour significant space within the overall hardware system and cause excessive noise.

Typically the gas/solid interface for a heat sink is the controlling resistance to heat transferred from a parallel fin heat sink. As air passes along the length of the fins, a thermal boundary layer grows on each fin acting as the resistance to heat flow from the fin. In addition, the temperature of the air rises as it passes the length of the heat sink as a result of the increased heat being dissipated to the air. Finally, since the fin has a higher efficiency in dissipating heat nearer the base the air temperature at this location is higher, again acting as a higher resistance to heat flowing from the fin.

In a design utilizing a finned heat sink it is desirable to duct air directly to the heat sink to maximize the heat transfer capability of the heat sink. However, many heat sink designs are not ducted and thus permit air flow to migrate out the top or around the sides of the heat sink. This gives rise to diminished flow within the fins and increases the resistance to heat flow at the gas/solid interface, thereby limiting the effectiveness of the heat sink design.

To provide greater air flow to the heat sink, some previous art has utilized piezoelectric fan blades. For example, Asia patent application, 1-233796, filed Sep. 19, 1989, teaches a parallel finned heat sink with piezoelectric fan blades interspersed within the fins. The blades vibrate to dissipate the heat from the fins of the heat sink. Similarly, U.S. patent 4,923,000, issued Mar. 3, 1989 to Richard D. Nelson deals with piezoelectric blades positioned between the fins of a fluid heat exchanger having a fluid inlet and outlet. Neither of these piezoelectric fan applications provide for the high velocity air flow to furnish efficient cooling. Other prior ad has utilized rotational means to achieve air flow. An illustration is U.S. Pat. No. 4,144,932, issued Jun. 2, 1977 to James R. Voigt, which deals with a heat generating component mounted to one side of a disk and fins on the other side. The disk has openings so that when the disk is rotated air flows through. Voigt's teachings only apply to circuits mounted on a rotating disk, not a fixed module.

Thus the prior art lacks the capacity to provide high velocity air flow in order to adequately cool both fixed finned heat sinks and components mounted on a printed circuit card. There exists, therefore, a need to improve the heat transfer characteristics of a parallel fin heat sink and at the same time provide an assembly that will significantly reduce the space required to provide the desired thermal performance. This embodiment presents a novel design of a parallel fin heat sink integrated with a "disk fan" to provide improved heat transfer characteristics and at the same time improved packaging density with reduced noise.

SUMMARY OF THE INVENTION

The preferred embodiment of this invention involves rotating a disk close to each fin of a parallel fin heat sink. A series of these disks mounted to a rotating shaft make up the fan. The fan is then mounted such that each disk is situated between two adjacent fins of the heat sink so that the composite structure consists of alternating disk and fin.

BRIEF DESCRIPTION OF THE DRAWINGS

The above and other features and advantages of the present invention will be described having reference to the accompanying drawings, wherein like reference numerals are used throughout to designate the same elements.

The following description explains the preferred embodiments of our invention, together with advantages and features, by way of example with reference to the above noted drawings.

DESCRIPTION OF THE PREFERRED EMBODIMENT

Figure 1:
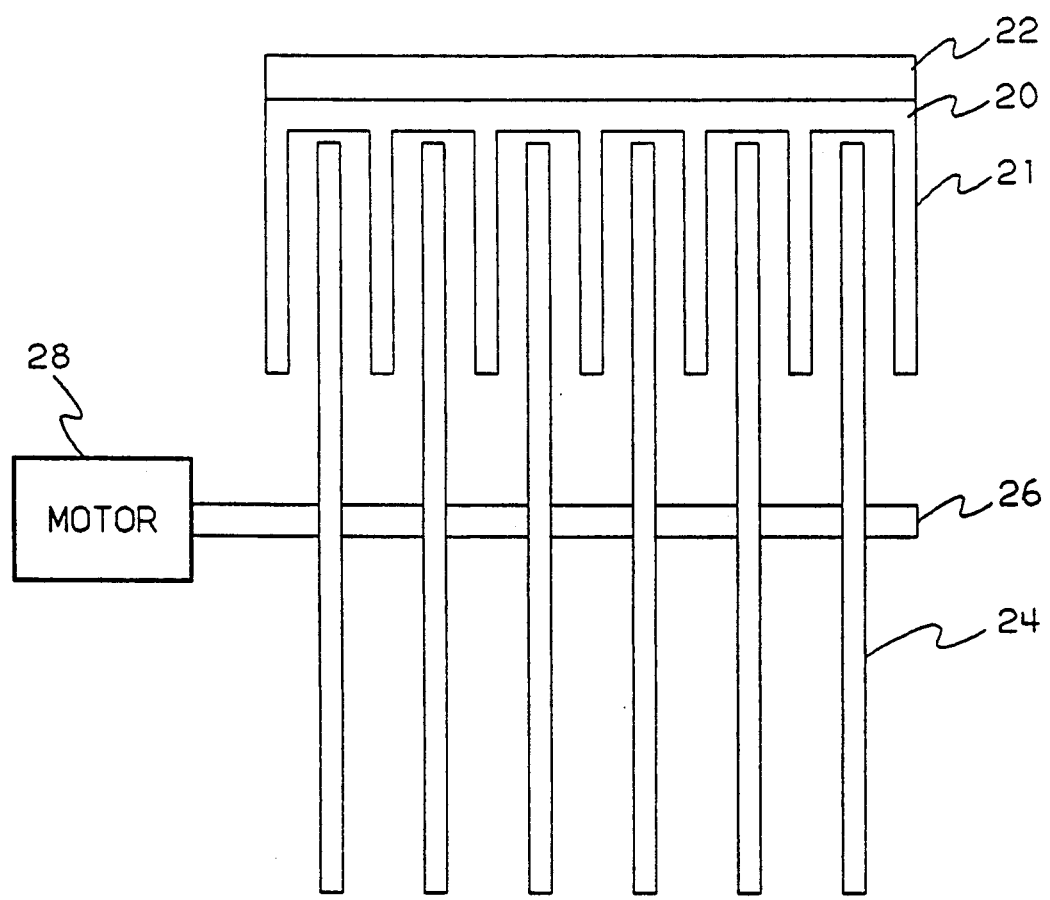
FIG. 1 depicts a disk fan used in conjunction with a parallel finned heat sink.

The present invention finds particular utility with high powered integrated circuit modules. In FIG. 1, a parallel fin heat sink 20 is shown attached to the top of a module 22. A series of disks 24 affixed to a rotating shaft 26 make up a "disk fan". The fan is connected to a motor 28. The disks are situated such that each disk is between adjacent fins 21 of the parallel fin heat sink so that the composite structure consists of alternating disk and fin.

This invention employs a boundary (i.e. at a surface of the rotating disk) moving parallel to a fixed boundary (i.e. at a surface of the fin) resulting in a straight line velocity profile varying from a maximum at the disk to zero at the fin. As the disk boundary and fin boundary move closer together the fin boundary is affected to a greater and greater degree (steeper velocity gradient) by the disk boundary. A steeper velocity gradient translates to increased heat transfer coefficients. The effect of the velocity gradient is to transfer momentum to the air, thereby providing a means of removal of heat from the fin.

Figure 2:
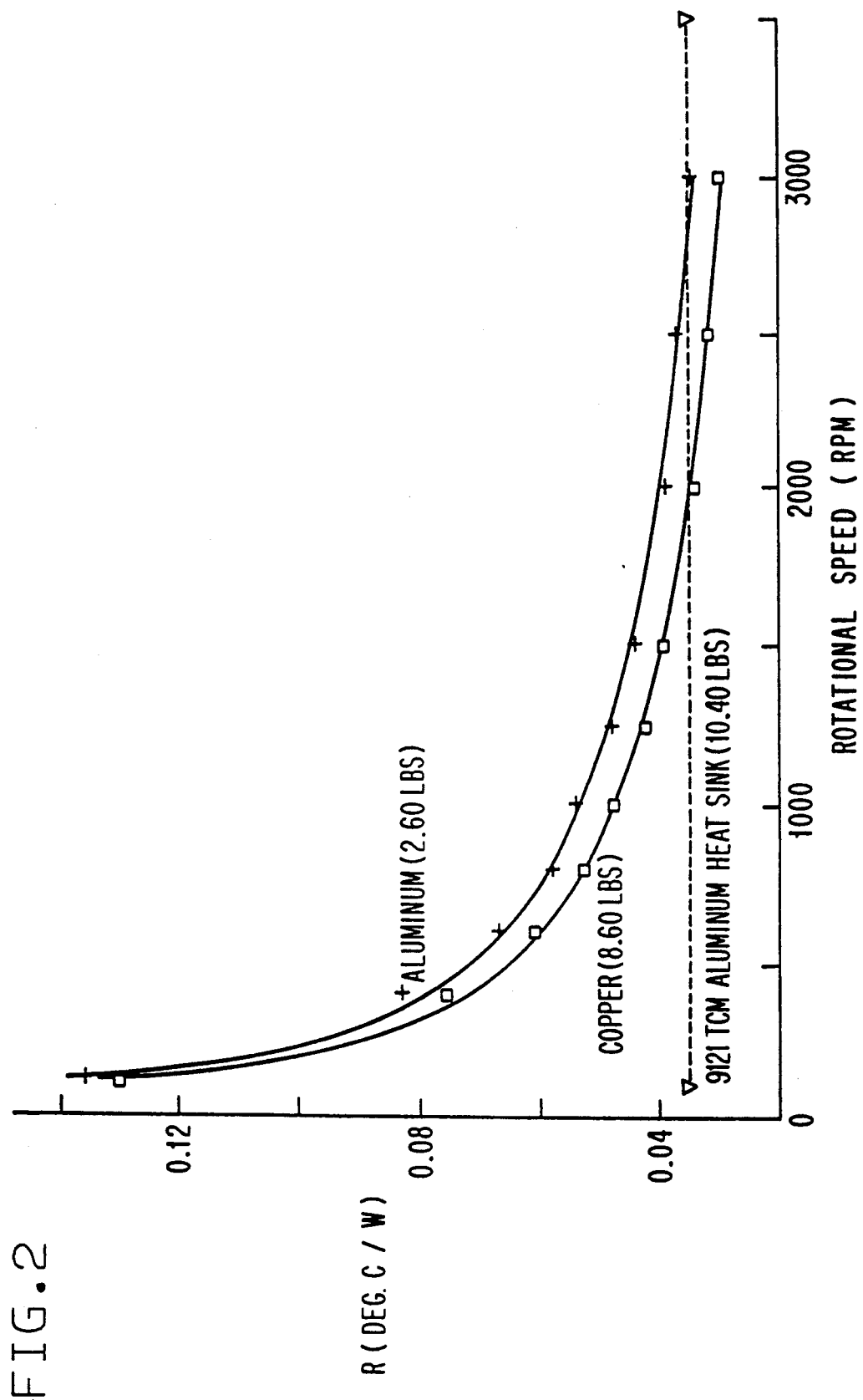
FIG. 2 is a graph showing a comparison of results for a traditional heat sink cooled by an air moving device and the disk augmented heat transfer system.

The high velocity air flow generated by the disk as well as the mechanical disruption of the air boundary layer on the fin results in significantly high convective heat transfer coefficients on the fin. This invention is compared to that of traditional design (air moving device forcing air through a parallel finned heat sink) in FIG. 2. Comparisons are based on the disk augmented system of the same overall dimensions as the traditional parallel fin heat sink design. The two curves show projections based on laboratory test results of a disk fan integrated with both copper and aluminum parallel finned heat sinks. As shown here, at increasing disk rotational speeds the performance of the heat sink significantly improves. (The thermal resistance in degrees C per watt is lower and thus more efficient cooling is provided by the heat sink.) The aluminum finned heat sink is slightly less effective than that of the copper due to the lower thermal conductivity of aluminum by about a factor of 2. Also shown on the graph is the aluminum heat sink employed in the thermal conduction module (TCM) used by the IBM ES/9000 model 9121 processor. The TCM heat sink employs a blower to force air through the heat sink. The performance of this heat sink shown by the dotted straight line (0.035 C/W) is less effective than the present invention using a copper heat sink and rotational disk speeds exceeding 2000 rpm or aluminum above a speed of 2800 rpm. Not only have the thermal characteristics of the heat sink been improved by implementing this invention, the heat sink weight has been diminished as well. In the case of the aluminum heat sink the weight has decreased fourfold and in the case of the copper by a factor of 1.2.

Many traditional fin designs are not ducted thereby permitting the flow to migrate out the top of the finned heat sink thereby limiting the effectiveness of the conventional designs. This invention avoids such a drawback. With the disk integrated into the fins of the heat sink, air flow occurs within the channels formed by the fins. The highest velocities occur at the largest radius of the disk coincident with the base of the fin and in the region where the greatest heat transfer is desired. Utilization of the disk provides very effective convective heat transfer coefficients over the fin area resulting in a more effective design.

The tests described above illustrating the thermal characteristics of the fin were performed with the disks overlapping the greatest portion of the rectangular fin. Smaller diameter disks overlapping less of the fin may also provide significant improvements in the thermal characteristics of the heat sink. The utility of smaller disks may be enhanced by entrainment occurring in the region radially just beyond the rim of the disk. This entrainment can extend the effectiveness of the disks and contribute significantly to the heat transferal.

In addition to increased heat removal, this invention also eliminates susceptibility to dust. Traditional heat sinks such as the heat sinks employed on the TCM's of the IBM System 9121 are highly susceptible to dust collecting on the inlet to the heat sink. When dust collects it impairs the effectiveness of the heat sink. The rotating disk design prevents this dust buildup and any dust in the system will be washed through the heat sink.

Using the disk augmented heat sink produces significantly less acoustical noise than a conventional air-moving device. First, the amount of air flow required in this design to produce a given thermal resistance is well below the air flow necessary in conventional designs. Second, studies on laminar flow fans have shown that disk fans are inherently quieter than conventional air movers. Since a major barrier to the use of air cooled heat sinks to cool high powered modules is the generation of acoustical noise created by the required air moving device(s), this invention is expected to have a significant impact on our ability to use air cooling in future systems.

Other modifications

Figure 3:
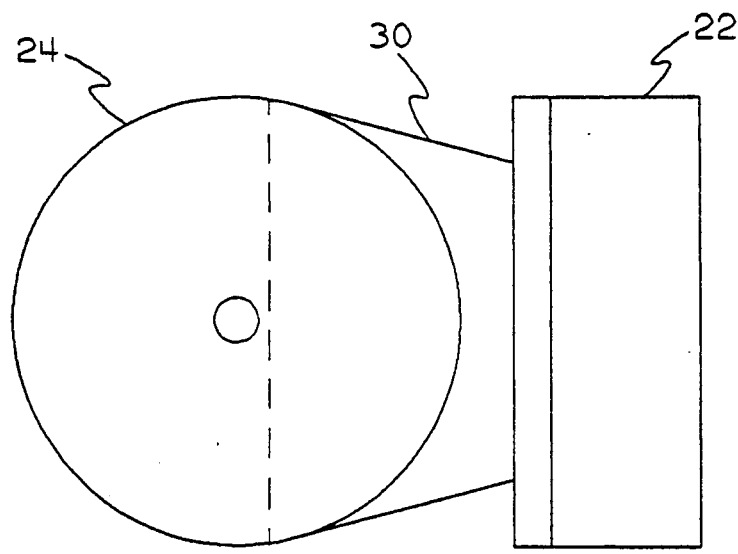
FIG. 3 shows an additional feature of this invention: trapezoidal fins integrated with the disk fan.

Further improvements to the disk augmented heat transfer system can be achieved by application of additional features:

Referring to FIG. 3, instead of a rectangular fin a trapezoidal fin 30 is employed with the smallest dimension of the trapezoid attached to the base near the module 22 allowing greater air flow at the base. This then further improves the areas of highest heat transfer (areas of the fin closest to the higher velocities of the disk 24).

Figure 4:
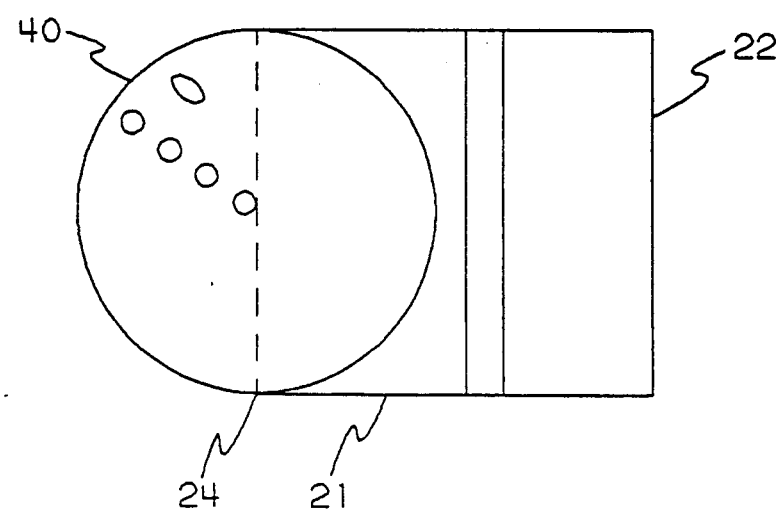
FIG. 4 shows an additional feature of this invention: protuberances or holes on the rotating disk.

Referring to FIG. 4, either holes or protuberances 40 of various shapes are added to the rotating disk 24. These nonuniformities in the disk cause mechanical disruption to the thermal boundary layer of the fin 21 of the heat sink attached to the module 22.

ALTERNATIVE PREFERRED EMBODIMENTS

Figure 5:
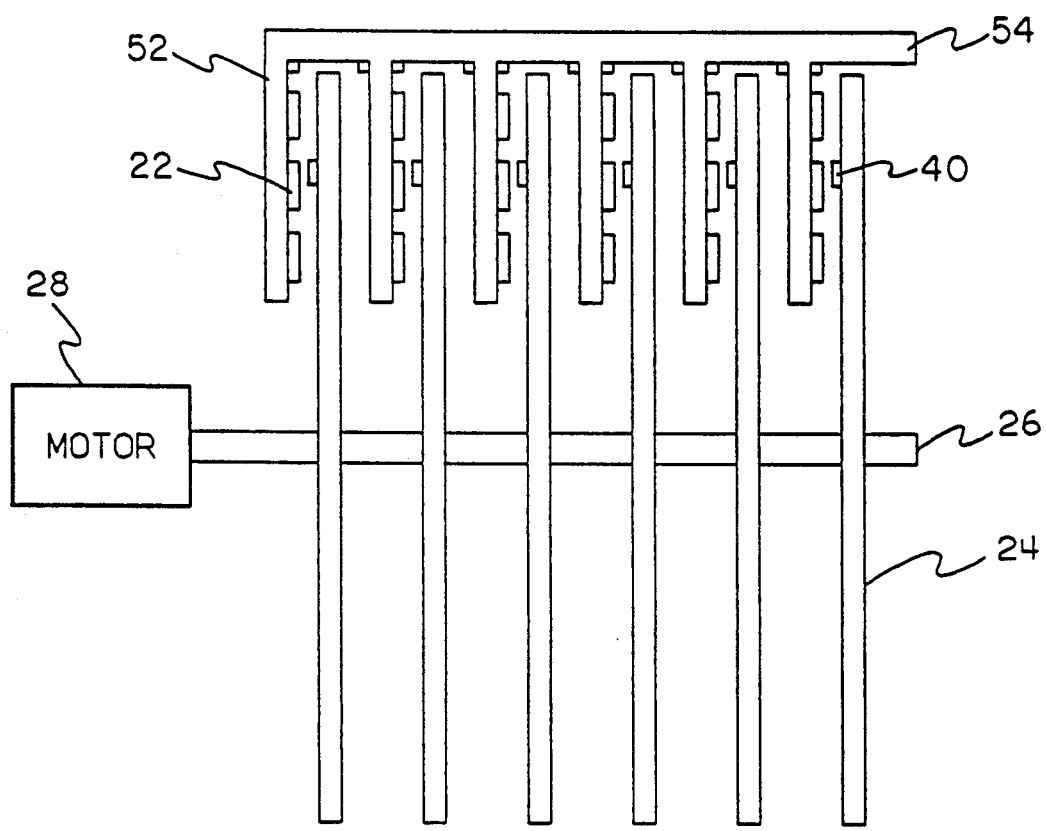
FIG. 5 depicts the disk fan used in conjunction with printed circuit cards.

This design is not solely applicable to a parallel finned heat sink. For example, in FIG. 5, rotating disks 24 mounted on shaft 26 connected to a motor 28 may be employed between printed circuit cards 52 containing modules 22. The printed circuit cards are attached to other circuits 54 in the electrical system. Furthermore, protuberances 40 (or, alternatively, holes) which enhance the heat transfer can be added to the disks 24.

While the present invention has been described having reference to a preferred embodiment and modifications thereto, it will be understood that those skilled in the ad, both now and in the future, may make various improvements and enhancements which fall within the scope of the claims which follow. These claims should be construed to maintain the proper protection for the invention first disclosed.

What is claimed is:

1. An air cooling system for integrated circuit packages which tend to collect particles and heat the air adjacent to said circuit packages during operation comprising:

a circuit package having a plurality of heat dissipative surfaces on members to be cooled, which surfaces are aligned in spaced substantially parallel planes which are mounted on and perpendicular to a base support surface;

a plurality of heat transfer disks and means for mounting said heat transfer disks for rotary movement adjacent to said heat dissipative surface;

said means for mounting said heat transfer disks including a disk drive shaft coupled to a motor, said disk drive shaft substantially parallel to the base support surface;

said heat transfer disks being mounted on said disk drive shaft at spaced locations such that a surface of said heat transfer disks is interposed in the space between said spaced substantially parallel planes proximate to and between said heat dissipative surfaces, and while continuously rotating said heat transfer disk removes said particles and said heat from the air adjacent to said circuit package.

2. The system of claim 1 wherein said circuit package comprises:

a package housing containing a plurality of integrated circuits within said housing which produce heat during operation;

a heat sink attached to said housing having a plurality of spaced parallel fins extending outwardly from and normal to the surface of said package housing.

3. An air cooling system for integrated circuit packages which tend to collect particles and heat the air adjacent to said circuit packages during operation comprising:

a circuit package having a heat dissipative surface;
said circuit package including in combination,
(a) plurality of printed circuit cards having means for connection to other circuits of an electrical system;
(b) said printed circuit cards connected to said other circuits such that said printed circuit cards are substantially parallel to each other and normal to said other circuits;
(c) said printed circuit cards having at least one package housing mounted thereupon; and
(d) said package housing containing a plurality of integrated circuits within the housing which produce heat during operation;

a plurality of heat transfer disks and means for mounting said heat transfer disks for rotary movement adjacent to said heat dissipative surface;
said means for mounting said heat transfer disks including a disk drive shaft coupled to a motor;
said heat transfer disks being mounted on said disk drive shaft at spaced locations such that a surface of said heat transfer disks is proximate said heat dissipative surface, and while continuously rotating said heat transfer disk removes said particles and said heat from the air adjacent to said circuit package.

4. An air cooling system for integrated circuit packages which tend to collect particles and heat the air adjacent to said circuit packages during operation comprising:

a circuit package having a heat dissipative surface;

a plurality of heat transfer disks and means for mounting said heat transfer disks for rotary movement adjacent to said heat dissipative surface;
said means for mounting said heat transfer disks including a disk drive shaft coupled to a motor
said heat transfer disks being mounted on said disk drive shaft at spaced locations such that a surface of said heat transfer disks is proximate said heat dissipative surface, and while continuously rotating said heat transfer disk removes said particles and said heat from the air adjacent to said circuit package;
said circuit package including in combination,
(a) a package housing containing a plurality of integrated circuits within said housing which produce heat during operation;
(b) a heat sink attached to said housing having a plurality of spaced parallel fins extending outwardly from and normal to the surface of said package housing; and
(c) said spaced parallel fins of said heat sink having a trapezoidal shape, said fins having a narrow section at the base of the heat sink closest to said heat conductive covering surface.

5. The system of claim 3 wherein said heat transfer disks include holes.

6. The system of claim 3 wherein said heat transfer disks include protuberances.

7. The system of claim 3 wherein said heat transfer disks include holes and protuberances.

8. The system of claim 4 wherein said heat transfer disks include holes.

9. The system of claim 4 wherein said heat transfer disks include protuberances.

10. The system of claim 4 wherein said heat transfer disks include holes and protuberances.

* * * * *